(12) United States Patent
Abdallah et al.

(10) Patent No.: US 8,718,202 B2
(45) Date of Patent: May 6, 2014

(54) REDUCED COMPLEXITY VITERBI DECODING

(75) Inventors: Rami Abdallah, Urbana, IL (US); Seok-Jun Lee, Allen, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1304 days.

(21) Appl. No.: 12/538,570

(22) Filed: Aug. 10, 2009

(65) Prior Publication Data
US 2010/0034324 A1 Feb. 11, 2010

Related U.S. Application Data

(60) Provisional application No. 61/087,774, filed on Aug. 11, 2008.

(51) Int. Cl.
*H04L 27/06* (2006.01)
*H04L 27/28* (2006.01)
*H03M 13/41* (2006.01)

(52) U.S. Cl.
USPC .................. 375/341; 375/261; 714/795

(58) Field of Classification Search
CPC ............ H03M 13/4169; H03M 13/4107; H03M 13/6502; H03M 13/41
USPC ........ 375/262, 261, 259, 316, 340, 341, 265; 714/792, 794, 795, 699, 786, 746
See application file for complete search history.

(56) References Cited

U.S. PATENT DOCUMENTS

| | | | |
|---|---|---|---|
| 5,027,374 A * | 6/1991 | Rossman ................. | 375/341 |
| 6,094,739 A * | 7/2000 | Miller et al. ............. | 714/792 |
| 6,141,384 A * | 10/2000 | Wittig et al. ............. | 375/240.25 |
| 6,690,750 B1 | 2/2004 | Hocevar et al. | |
| 6,901,118 B2 | 5/2005 | Hocevar et al. | |
| 7,035,356 B1 * | 4/2006 | Langhammer ........... | 375/341 |
| 7,117,426 B2 | 10/2006 | Wu et al. | |
| 7,299,180 B2 | 11/2007 | Wang et al. | |
| 7,467,359 B2 | 12/2008 | Potkonjak et al. | |
| 7,496,159 B2 | 2/2009 | Wu et al. | |
| 2004/0111264 A1 | 6/2004 | Wang et al. | |
| 2004/0122883 A1 | 6/2004 | Lee et al. | |
| 2004/0190651 A1 | 9/2004 | Huggett | |
| 2004/0194005 A1 | 9/2004 | Huggett | |
| 2004/0243916 A1 | 12/2004 | Kim et al. | |
| 2005/0117673 A1 | 6/2005 | Wu et al. | |
| 2005/0120287 A1 | 6/2005 | Wu et al. | |
| 2005/0138535 A1 | 6/2005 | Parthasarathy et al. | |

(Continued)

FOREIGN PATENT DOCUMENTS

| WO | 2004071002 A1 | 8/2004 |
|---|---|---|
| WO | 2007148100 A1 | 12/2007 |
| WO | 2008048690 A3 | 4/2008 |
| WO | 2009044931 A1 | 4/2009 |

*Primary Examiner* — Sam K Ahn
*Assistant Examiner* — Vineeta Panwalkar
(74) *Attorney, Agent, or Firm* — Steven A. Shaw; Wade James Brady, III; Frederick J. Telecky, Jr.

(57) ABSTRACT

A system includes a Viterbi decoder. The Viterbi decoder includes add compare select logic. The add compare select logic determines path metrics for an encoded signal. The add compare select logic also is shared to determine a best state by which trace-back procedure gets started, resulting in hardware saving.

5 Claims, 4 Drawing Sheets

(56) References Cited

U.S. PATENT DOCUMENTS

| | | |
|---|---|---|
| 2006/0067436 A1 | 3/2006 | Potkonjak et al. |
| 2007/0113161 A1 | 5/2007 | Lingam et al. |
| 2007/0153693 A1* | 7/2007 | Takanashi ............ 370/232 |
| 2008/0072127 A1 | 3/2008 | Chakraborty |
| 2008/0098288 A1 | 4/2008 | Yang et al. |
| 2009/0089648 A1 | 4/2009 | Tsui et al. |
| 2009/0099841 A1 | 4/2009 | Chen |
| 2009/0100319 A1 | 4/2009 | Potkonjak et al. |
| 2009/0110126 A1 | 4/2009 | Lee et al. |

\* cited by examiner

REDUCED COMPLEXITY VITERBI DECODING

CROSS-REFERENCE TO RELATED APPLICATIONS

The present application claims priority to U.S. Ser. No. 61/087,774 filed on Aug. 11, 2008 and entitled "Reduced Complexity Viterbi Decoding Via a Low Complexity Best State Search," which is herein incorporated by reference.

BACKGROUND

Andrew Viterbi developed a decoding algorithm in the 1960s that is now known as the Viterbi algorithm. A decoder that implements the Viterbi algorithm is known as a Viterbi decoder. The Viterbi algorithm is used to decode a particular convolutional code using maximum-likelihood concepts, and Viterbi decoders currently decode data communications, wired communications, and wireless voice communications. Viterbi decoders, unfortunately, are relatively resource hungry for industries constrained in every consideration by power limitations. Thus, any reduction in the power consumed by Viterbi decoders would be advantageous, in particular, for mobile applications.

SUMMARY

Systems and methods for reduced complexity Viterbi decoding are described herein. In at least some disclosed embodiments, a system includes a Viterbi decoder. The Viterbi decoder includes branch metric logic, add compare select (ACS) logic, and trace-back memory and logic. The branch metric logic computes the cost on each possible path on a trellis. The add compare select logic determines path metrics for an encoded signal. To determine a best-state out of many possible states, the add compare select logic is re-used. The determined path history is stored in the trace-back memory and once enough path history is accumulated, the trace-back logic traces back the path and decodes the information to be transmitted over noisy channels.

In other disclosed embodiments, a method includes ceasing to determine path metrics and select the more likelihood path for an encoded signal using an add compare select logic. The method further includes determining a best state using the add compare select logic, and resuming accumulation of path metrics of the encoded signal using the add compare select logic.

In yet other disclosed embodiments, a system includes a Viterbi decoder comprising decoding logic. The decoding logic determines path metrics for an encoded signal, and the decoding logic determines a best state.

These and other features and advantages will be more clearly understood from the following detailed description taken in conjunction with the accompanying drawings and claims.

BRIEF DESCRIPTION OF THE DRAWINGS

For a more complete understanding of the present disclosure, reference is now made to the accompanying drawings and detailed description, wherein like reference numerals represent like parts.

DETAILED DESCRIPTION

Figure 1A:
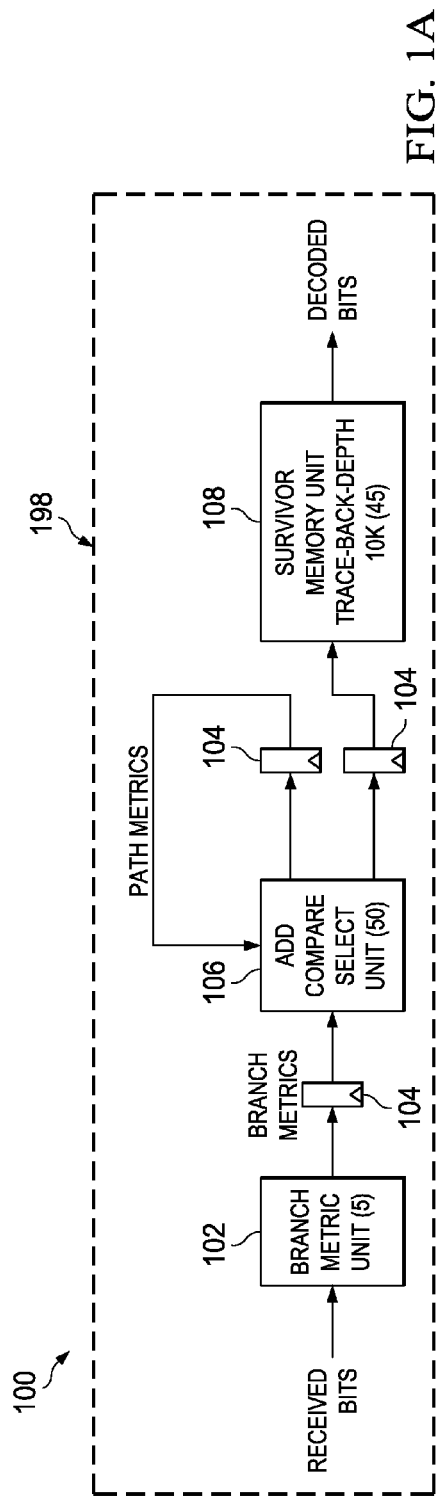
FIGS. 1A-1C illustrate complexity reduction in systems of Viterbi decoding in accordance with at least some exemplary embodiments.

Certain terms are used throughout the following claims and description to refer to particular components. As one skilled in the art will appreciate, different entities may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean an optical, wireless, indirect electrical, or direct electrical connection. Thus, if a first device couples to a second device, that connection may be through an indirect electrical connection via other devices and connections, through a direct optical connection, etc. Additionally, the term "system" refers to a collection of two or more hardware components, and may be used to refer to an electronic device.

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one having ordinary skill in the art will understand that the following description has broad application, and the discussion of any embodiment is meant only to be exemplary of that embodiment, and not intended to intimate that the scope of the disclosure, including the claims, is limited to that embodiment.

The market for wireless electronic devices ("WEDs") is experiencing tremendous growth along with wireless technology such as DVB-H, WiMAX, LTE, 802.11 Wireless LAN, and etc. A WED includes a radio receiver or transceiver device coupled to an antenna. Currently, there are several implementations of wireless technology in an electronic device. Examples of wireless technologies include LTE, WiMAX, wireless LAN, UWB, DVB-H, and T-DMB.

LTE, short for Long Term Evolution, is the fourth generation of radio technologies designed to increase the capacity and speed of mobile telephone networks. Because the current generation of mobile telecommunication networks are known as 3G, LTE has been given the name 4G.

WiMAX, short for Worldwide Interoperability for Microwave Access, is a telecommunications technology that provides wireless transmission of data using a variety of transmission modes, from point-to-multipoint links to portable and fully mobile internet access.

A wireless LAN, short for wireless local area network, links two or more computers or devices using spread-spectrum or OFDM, short for orthogonal frequency-division multiplexing, modulation technology to enable communication between devices in a limited area. This technology gives users the mobility to move around within a broad coverage area and still be connected to the network.

UWB, short for ultra-wideband or ultraband, is a radio technology that can be used at very low energy levels for short-range high-bandwidth communications by using a large portion of the radio spectrum.

DVB-H (Digital Video Broadcasting-Handheld) is one of three prevalent mobile TV formats. It is a technical specification for bringing broadcast services to mobile handsets. DVB-H was formally adopted as ETSI standard EN 302 304 in November 2004.

Terrestrial Digital Multimedia Broadcasting (T-DMB) is a digital radio transmission technology developed by South Korea as part of the national IT project for sending multimedia such as TV, radio and datacasting to mobile devices such as mobile phones. Satellite Digital Multimedia Broadcasting is known as S-DMB.

ISDB (Integrated Services Digital Broadcasting) is maintained by the Japanese organization ARIB. The core standards of ISDB are ISDB-S (satellite television), ISDB-T (terrestrial), ISDB-C (cable) and 2.6 GHz band mobile broadcasting which are all based on MPEG-2 video and audio coding as well as the transport stream described by the MPEG-2 standard, and are capable of high definition television (HDTV). ISDB-T and ISDB-Tsb are for mobile reception in TV bands. 1seg is the name of an ISDB-T service for reception on cell phones, laptop computers and vehicles.

Devices implementing these and other communication methods operate in power-starved environments. However, by using a less complex implementation of Viterbi decoding, saved power can be diverted elsewhere, or the life of the device can be extended.

Communication technology involves a transmitter sending a signal to a receiver. Such a signal is sent over wires or wireless channels. The received signal may not be the same as the transmitted signal due to various factors, e.g., noise. The term "decoding," as used in the communication context, refers to using the received signal to estimate which transmit signal, out of multiple possible transmit signals, was transmitted. The Viterbi algorithm is an efficient procedure for solving maximum likelihood sequence estimation (MLSE) problems such as decoding of convolutional codes. The Viterbi algorithm estimates the most likely sequence of encoder states transitions given the received noisy samples.

Considering a mapping of all the possibly transmitted signals onto a coordinate system, a similarly mapped received signal will not be located exactly on the transmitted signal, as expected, due to the factors mentioned above. Rather, the received signal may be in between the possibly transmitted signals, closer to some, and further from others. Decoders using maximum likelihood techniques employ the assumption that the further away the received signal is from a particular possibly transmitted signal on the mapping, the less likely the particular possibly transmitted signal is the transmitted signal. Accordingly, the closer the received signal is to a particular possibly transmitted signal, the more likely the particular possibly transmitted signal is the transmitted signal.

Figure 1B:
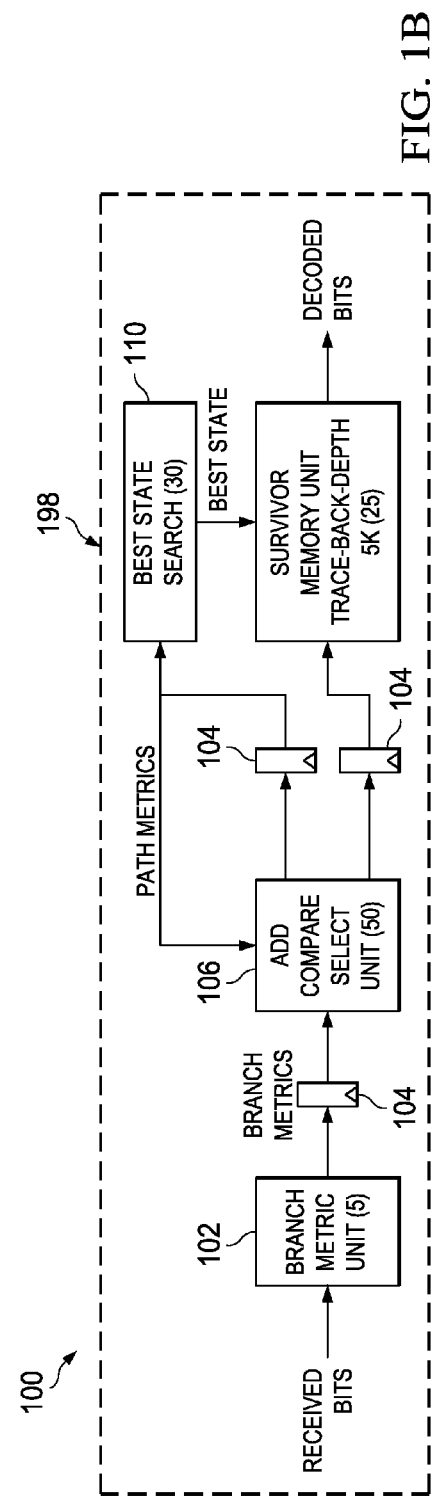
Figure 1C:
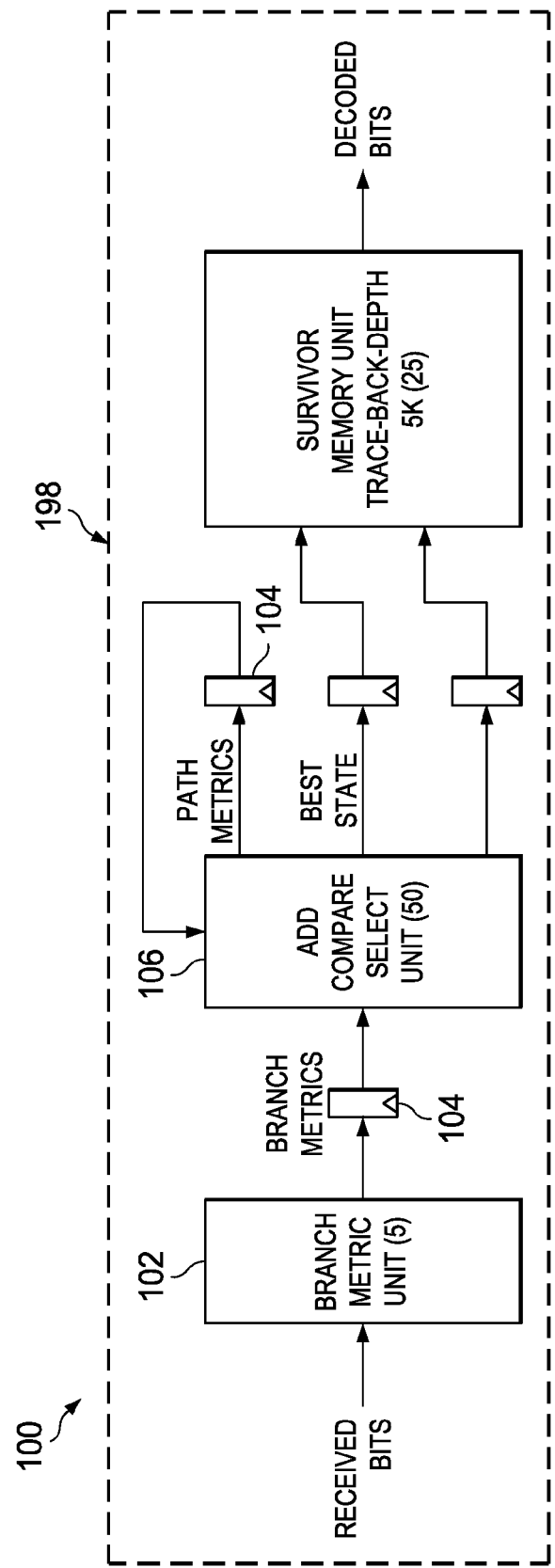
Figure 2:
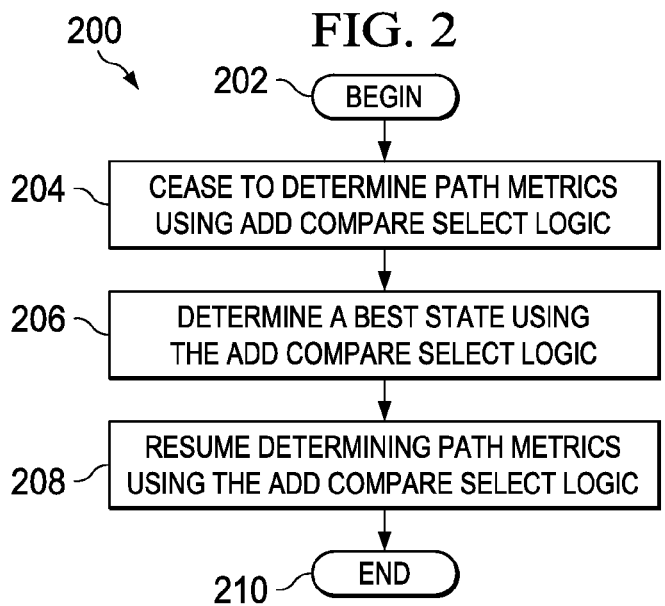
FIG. 2 illustrates a method of reduced complexity Viterbi decoding in accordance with at least some exemplary embodiments.

FIG. 1 illustrates complexity reduction in Viterbi decoding in accordance with at least some embodiments. FIG. 2 illustrates a method of reduced complexity Viterbi decoding in accordance with at least some embodiments. FIG. 3 illustrates the timing and benefits of reduced complexity Viterbi decoding in accordance with at least some embodiments. Considering the common elements of FIGS. 1A-1C, the system 100 preferably comprises a Viterbi decoder 198. The decoder 198 preferably uses the Viterbi algorithm for decoding a signal (represented as a bitstream) that has been encoded using forward error correction based on a convolutional code.

The decoder 198 preferably comprises a branch metric unit ("BMU") 102, an add compare select unit ("ACSU") 106 (sometimes known as a path metric unit or PMU) coupled to the BMU 105, and a survivor memory unit ("SMU") 108 (sometimes known as a trace back unit or TBU) coupled to the ACSU 106. The decoder 198 preferably comprises buffering logic 104 to control data flow. The buffering logic includes, but is not limited to, delays, flip flops, queues, SRAM, etc.

The BMU 102 determines "branch metrics" for each possibly transmitted signal ("received bits"). Branch metrics are distances between the received signal and the possibly transmitted signals on the mapping as discussed above. In at least one embodiment, branch metrics are determined by taking the absolute value of the difference between the received signal and a possibly transmitted signal, and squaring the result. The BMU 102 forwards each calculated branch metric to the ACSU 106.

The ACSU 106 is configured to receive the branch metrics as inputs. The ACSU preferably determines path metrics based on the branch metrics. In at least one embodiment, determining path metrics comprises accumulating, comparing, and selecting path metrics. The ACSU 106 uses the branch metrics to get the selected path metrics for $2^{(K-1)}$ paths, one of which can eventually be chosen as optimal, where K is the constraint length of a convolutional code. At every clock the ACSU 106 makes $2^{(K-1)}$ decisions. A decision is selecting optimal or nonoptimal paths via comparing the accumulated path metrics. The outputs of the ACSU 106 are passed to the SMU 110 and stored in storage.

Figure 3A:
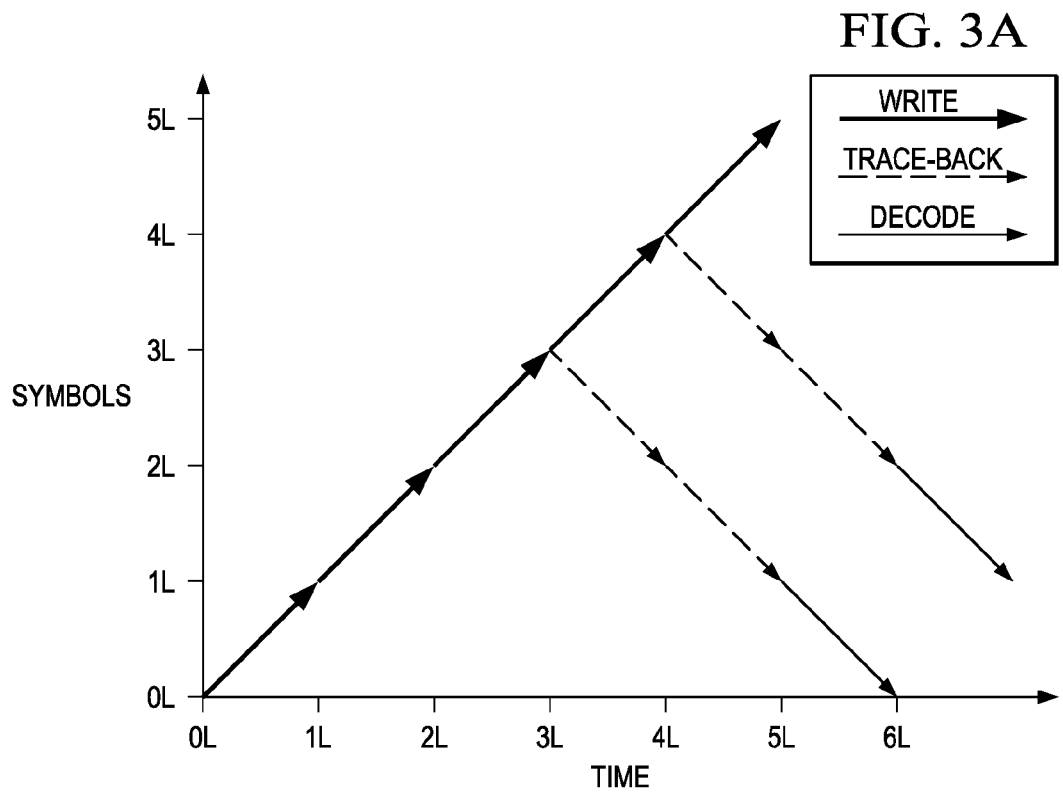
FIGS. 3A-3C illustrate timing of Viterbi decoding operations in systems and methods of Viterbi decoding in accordance with at least some exemplary embodiments.

The SMU 108 determines the maximum-likelihood path via tracing back along the trellis. A trellis is a sideways tree diagram used to represent different possible encoder states at different times. The individual branches of the trellis are associated with branch metrics, and paths through the trellis, comprising branch metrics, are associated with path metrics. The path metric is inversely proportional to the log likelihood probability of the path with which it is associated in at least one embodiment. The Viterbi algorithm recursively finds the path with the minimum path metric for each state. Trace back is the process of iteratively working backward through the trellis by, for a selected state, selecting the most likely state that led to the selected state, and saving the most likely state as the new selected state on which to repeat the process. The string of most likely states forms a maximum likelihood path through the trellis. Two ways to decide how to begin tracing back are: 1) begin trace back from a random state on the trellis or 2) begin trace back from the "best state" on the trellis. Generally, if a random state is selected from which to start traceback, two times the trace-back depth is required than if a best state is used as starting point. Hence, a best state is a good candidate for ultimately finding the correct transmitted signal. FIG. 1A depicts random-state trace back. The numbers in parentheses indicate the proportional complexity of each portion of logic of the decoder 198: the BMU 102 comprises 5% of the decoder 198, the ACSU comprises 50% of the decoder 198, and the SMU comprises 45% of the decoder 198 for random state trace back. The decoded bits output by the SMU 108 represent the possibly transmitted symbol with the highest likelihood of being sent based on the received signal or "symbols." FIG. 3A illustrates the time necessary to determine the decoded bits based on the received symbols in terms of the block length "L," which represents one block of bits or discrete portions of information processed together. For example, if it takes 3L time to write 3L symbols into memory for the SMU 108, it will take two thirds as long (2L time, spanning from 3L to 5L) to perform trace back from a random state, and one third as long (1L time, spanning from 5L to 6L) until the symbols are decoded.

Figure 3B:
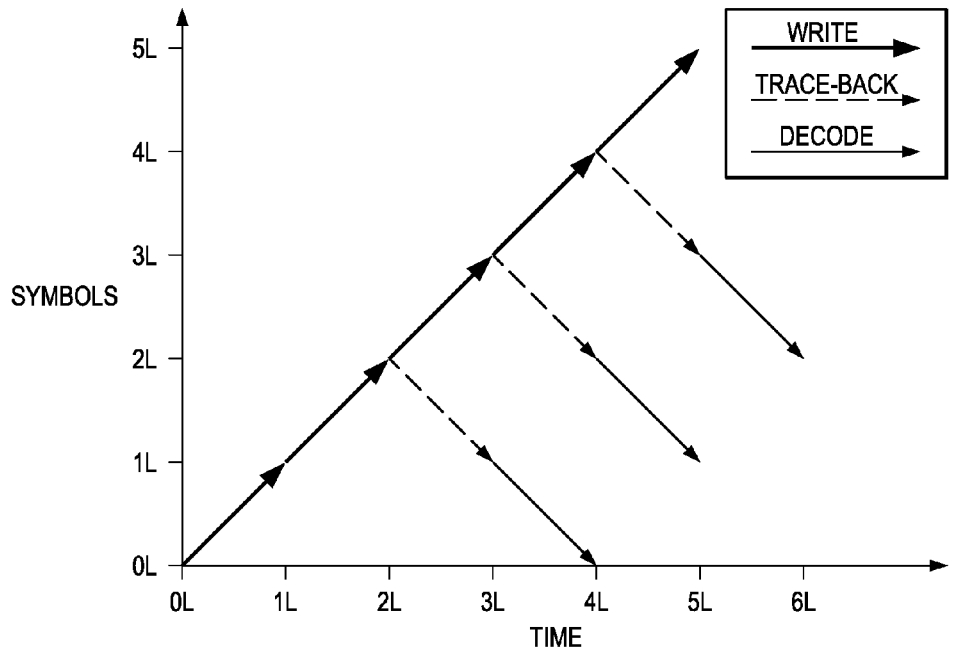

FIGS. 1B and 3B illustrate that the trace back time can be reduced by beginning trace back from a best state because the best-state trace-back reduces the traceback depth by half. The numbers in the parentheses indicate the proportional complexity of each portion of logic of the decoder 198 relative to FIG. 1A. The BMU 102 and ACSU 106 are unchanged. The SMU can be reduced in complexity because best state search logic 110 is added such that the best state is provided to the SMU 108. However, an additional 10% of total logic of the decoder 198 in FIG. 1A must be added (the decoder in FIG. 1B totaling 110% of the decoder in FIG. 1A) to achieve the reduction illustrated in FIG. 3B: in the time it takes to write 2L worth of symbols to memory (2L time, spanning from 0 to 2L), trace back and decoding (1L time each, spanning from 2L to 3L and 3L to 4L, respectively) can be performed. As can be seen, in order to decrease trace back time, more logic is necessary.

Figure 3C:
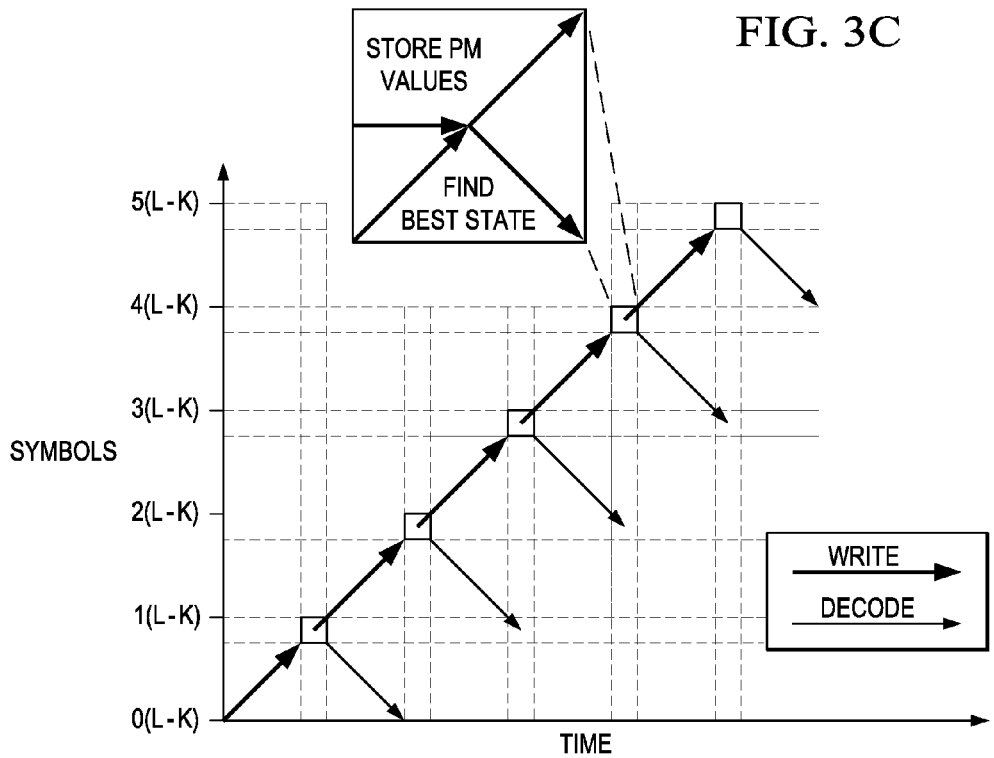

However, FIGS. 1C and 3C illustrate that using the ASCU 106 to determine the best state results in significant complexity reduction for a small latency cost. Specifically, when compared to FIG. 1A, the decoder 198 of FIG. 1C is 80% as complex. The small latency cost arises because the ACSU 106 ceases to determine path metrics during determination of the best state. Specifically, the ACSU 106 determines a best state in K clock cycles, K equal to code constraint length used to encode the signal if one trellis section is processed per cycle, (the so-called radix-2 architecture). The ACSU 106 resumes determining path metrics after determination of the best state. Preferably, the ACSU 106 compares path metrics to determine the best state, and is not part of a trace back unit or survivor memory unit. As such, the SMU 108 does not perform best state search and can be reduced in complexity.

The ACSU 106 is preferably comprised of decoding logic such as add compare select ("ACS") logic. However, any type of decoding logic is within the scope of this disclosure. Preferably, no other logic determines the best state. The ACS logic includes elements such as adders, code converters, a maximum or minimum select logic, decision logic, and delay logic. During determination of the best state, branch metrics are preferably set to zero and a specific set of the ACS logic are activated each clock cycle to behave like a compare-select unit.

To determine the best state, the ACSU 106 is configured to select possibly transmitted signals, corresponding to the smaller path metrics, from consideration as the transmitted signal by comparing each path metric with other path metrics. Such selection occurs recursively, until only the smallest path metric remains, representing the possibly transmitted signal which is the closest to the received signal.

FIG. 2 illustrates a method 200 of reduced complexity Viterbi decoding beginning at 202 and ending at 210. At 204, path metrics cease to be determined using add compare select logic. At 206, a best state is determined using the add compare select logic. The path metrics are preferably compared, the metric comprising the highest (or lowest depending on the definition of branch metric) is selected, and the best state corresponding to the metric is selected for best state purposes. Preferably, determining a best state comprises determining a best state in K clock cycles, K equal to code constraint length if one trellis section is processed per cycle. Preferably, the add compare select logic are not part of a trace back unit or survivor memory unit. At 208, determining the path metrics using the add compare select logic is resumed.

The system 100 and/or method 200 is preferably implemented in a wireless electronic device ("WED") such as a cellular phone, desktop computer, notebook computer, handheld computer, calculator, e-book reader, satellite, modem, or personal digital assistant. These WEDs use communication standards such as LTE, WiMAX, Wireless LAN, and UWB, and the system 100 and/or method 200 is compatible with each.

Other conditions and combinations of conditions will become apparent to those skilled in the art, including the combination of the conditions described above, and all such conditions and combinations are within the scope of the present disclosure. Additionally, audio or visual alerts may be triggered upon successful completion of any action described herein, upon unsuccessful actions described herein, and upon errors.

The above disclosure is meant to be illustrative of the principles and various embodiment of the present invention. Numerous variations and modifications will become apparent to those skilled in the art once the above disclosure is fully appreciated. Also, the order of the actions shown in FIG. 2 can be varied from order shown, and two or more of the actions may be performed concurrently. It is intended that the following claims be interpreted to embrace all variations and modifications.

We claim:

1. A method, comprising:
    ceasing to determine path metrics for an encoded signal using add compare select logic in a hardware Viterbi decoder;
    determining a best state using the add compare select logic in $\text{ceil}((K-1)/r)$ clock cycles, K equal to code constraint length of the hardware Viterbi decoder processing r trellis-sections per cycle, where $r=\log_2 R$ and R is Radix-R add compare select unit (ACSU) data-path; and
    resuming determination of path metrics of the encoded signal using the add compare select logic.

2. The method of claim 1, determining the best state comprising comparing path metrics.

3. The method of claim 1, resuming decoding comprising resuming determination of path metrics of the encoded signal using the add compare select logic.

4. The method of claim 1, determining the best state comprising determining the best state using the add compare select logic, which are not part of a trace back unit or survivor memory unit.

5. A system, comprising:
    a Viterbi decoder including an add compare select unit (ACSU), the Viterbi decoder configured to determine path metrics for an encoded signal;
    wherein the Viterbi decoder is configured to determine a best state in $\text{ceil}((K-1)/r)$ clock cycles, K equal to code constraint length of the Viterbi decoder processing r trellis-sections per cycle, where $r=\log_2 R$ and R is Radix-R ACSU data-path,
    wherein the Viterbi decoder is configured to cease to determine path metrics during the determination of the best state, and
    wherein the Viterbi decoder is configured to resume determining path metrics after the determination of the best state.

* * * * *